(12) United States Patent
Pautsch et al.

(10) Patent No.: US 7,478,769 B1
(45) Date of Patent: Jan. 20, 2009

(54) METHOD AND APPARATUS FOR COOLING ELECTRONIC COMPONENTS

(75) Inventors: Gregory W. Pautsch, Chippewa Falls, WI (US); Adam Pautsch, Madison, WI (US)

(73) Assignee: Cray Inc., Seattle, WA (US)

( * ) Notice: Subject to any disclaimer, the term of this patent is extended or adjusted under 35 U.S.C. 154(b) by 419 days.

(21) Appl. No.: 11/075,832

(22) Filed: Mar. 9, 2005

(51) Int. Cl.
B05B 1/14 (2006.01)
B05B 1/34 (2006.01)
F25D 23/12 (2006.01)
F28D 15/00 (2006.01)
H05K 7/20 (2006.01)

(52) U.S. Cl. .................. 239/555; 239/11; 239/462; 239/463; 239/553.3; 62/259.2; 165/104.33; 361/699

(58) Field of Classification Search .......... 239/555, 239/11, 462, 463, 553.3, 468, 472, 486, 487, 239/518, 536, 548, 553, 556–558, 560, 561, 239/590, 590.3, 596, 601; 62/259.2, 304, 62/310; 165/104.33; 361/699, 687–689; 257/712, 714
See application file for complete search history.

(56) References Cited

U.S. PATENT DOCUMENTS

| | | | |
|---|---|---|---|
| 3,881,701 A | 5/1975 | Schoenman et al. | |
| 4,380,786 A | 4/1983 | Kelly | |
| 5,072,883 A | 12/1991 | Vidusek | |
| 5,220,804 A | 6/1993 | Tilton et al. | |
| 5,270,572 A * | 12/1993 | Nakajima et al. | 257/714 |
| 5,297,738 A | 3/1994 | Lehr et al. | |
| 5,311,931 A | 5/1994 | Lee | |
| 5,435,884 A | 7/1995 | Simmons et al. | |
| 5,456,596 A | 10/1995 | Gourdine | |
| 5,472,143 A | 12/1995 | Bartels et al. | |
| 5,740,967 A | 4/1998 | Simmons et al. | |
| 5,768,103 A * | 6/1998 | Kobrinetz et al. | 361/699 |
| 5,836,520 A * | 11/1998 | Bhandarkar et al. | 239/553.5 |
| 5,860,602 A | 1/1999 | Tilton et al. | |
| 5,943,211 A * | 8/1999 | Havey et al. | 361/699 |
| 5,951,882 A | 9/1999 | Simmons et al. | |
| 6,016,969 A | 1/2000 | Tilton et al. | |
| 6,366,461 B1 | 4/2002 | Pautsch et al. | |
| 6,484,521 B2 * | 11/2002 | Patel et al. | 62/171 |
| 6,498,725 B2 * | 12/2002 | Cole et al. | 361/700 |
| 6,857,283 B2 * | 2/2005 | Tilton et al. | 62/259.2 |
| 6,952,346 B2 * | 10/2005 | Tilton et al. | 62/259.2 |
| 7,082,778 B2 * | 8/2006 | Patel et al. | 62/259.2 |
| 7,159,414 B2 * | 1/2007 | Tilton et al. | 62/304 |
| 2003/0167383 A1 | 9/2003 | Gupta et al. | |

(Continued)

OTHER PUBLICATIONS

U.S. Appl. No. 10/643,738 Response filed Jan. 16, 2006 non-final office action mailed Sep. 26, 2005, 13 pgs.

(Continued)

*Primary Examiner*—Darren W Gorman
(74) *Attorney, Agent, or Firm*—Schwegman, Lundberg & Woessner, P.A.

(57) ABSTRACT

A spray cooling system includes a spray delivery device and a cooling liquid delivered to the spray delivery device. The spray delivery device includes one or more inlet apertures and one or more corresponding outlet apertures, at least one pair of inlet aperture and corresponding outlet aperture being positioned relative to each so as to form an asymmetric non-uniform density full-cone spray pattern.

15 Claims, 5 Drawing Sheets

U.S. PATENT DOCUMENTS

2004/0050545 A1* 3/2004 Tilton ................ 165/287

OTHER PUBLICATIONS

U.S. Appl. No. 10/643,738 Response filed Jun. 19, 2006 non-final office action mailed Feb. 17, 2006, 10 pgs.

U.S. Appl. No. 10/643,738, Final Office Action mailed Apr. 17, 2007, 12 pgs.

U.S. Appl. No. 10/643,738, Non-Final Office Action mailed Nov. 1, 2007, 19 pgs.

U.S. Appl. No. 10/643,738, Non-Final Office Action mailed Feb. 17, 2006, 9 PGS.

U.S. Appl. No. 10/643,738, Non-Final Office Action mailed Sep. 26, 2005, 11 pgs.

U.S. Appl. No. 10/643,738, Responce filed Jul. 17, 2007 final office action mailed Apr. 17, 2007, 17 pgs.

U.S. Appl. No. 10/643,738, Non-Final Office Action Mailed Nov. 1, 2007, OARN, 3 pgs.

* cited by examiner

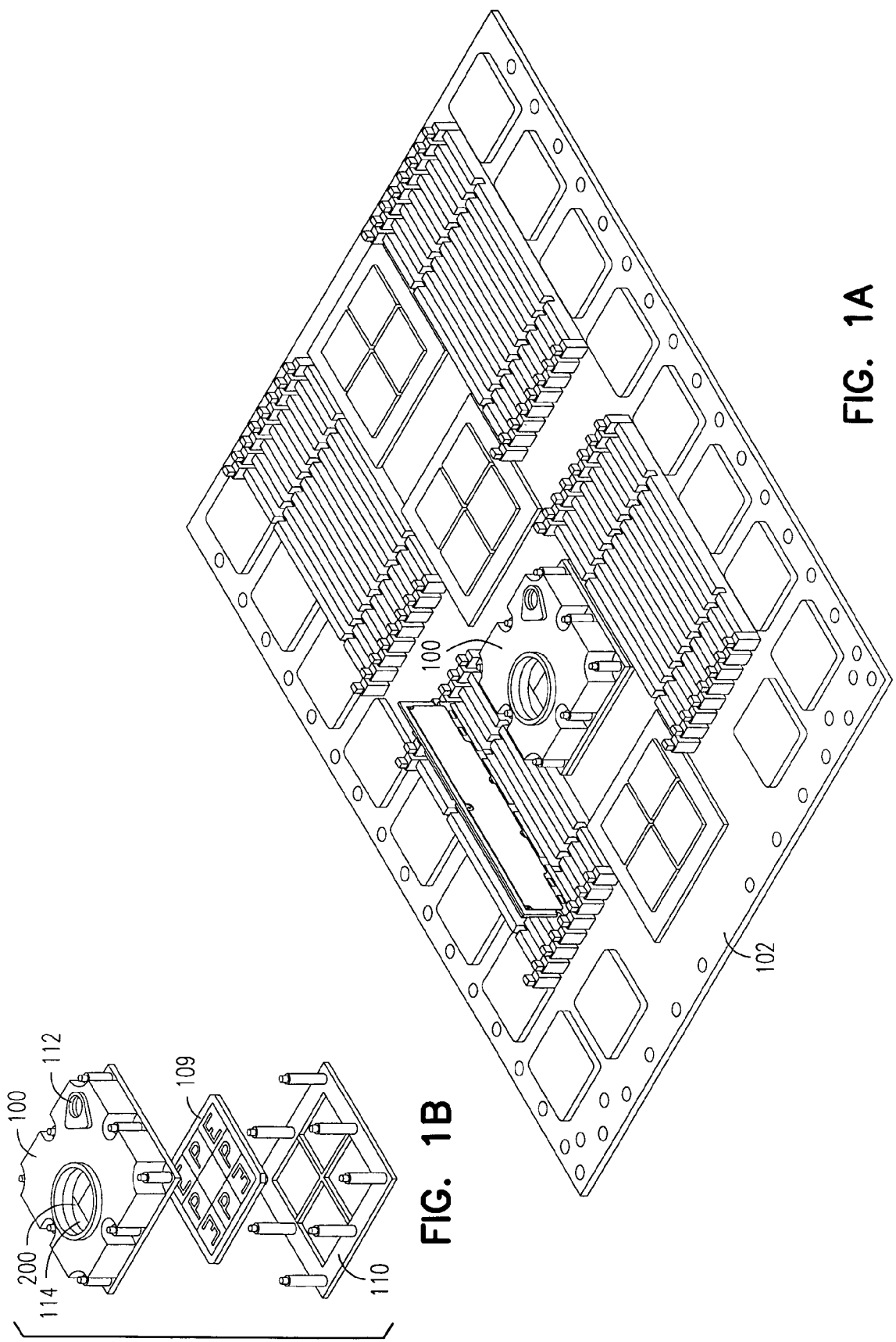

METHOD AND APPARATUS FOR COOLING ELECTRONIC COMPONENTS

FIELD OF THE INVENTION

The present invention is related to cooling of electronic equipment, and more particularly to cooling electronics components.

BACKGROUND

Demand for higher performance supercomputers continues to create challenging thermal and packaging design environments. One cooling method utilizes direct liquid cooling with dielectric fluids. Direct liquid cooling circumvents the problems of high thermal interface resistance associated with conventional technologies and is capable of providing very high heat transfer rates. One method for cooling high heat flux electronic components is spray cooling. Spray cooling is a process where a fluid is sprayed onto the surface of a heat generating component at a rate that maintains a continuously wetted surface. The fluid on the hot surface absorbs the heat thus removing the heat from the surface of the component. However, there is a need for improvements to present spray cooling systems to better tailor the cooling to the specific application.

SUMMARY

One aspect of the present invention includes a spray delivery device including one or more inlet apertures and one or more corresponding outlet apertures. The device is configured such that each pair of corresponding inlet apertures and outlet apertures forms an asymmetrical, non-uniform density, full-cone spray pattern.

One aspect provides a method including delivering a cooling fluid to a spray delivery device, and positioning an inlet aperture relative to an outlet aperture on the spray delivery device such that the cooling fluid delivered through the spray delivery device forms an asymmetrical non-uniform density full cone spray pattern.

BRIEF DESCRIPTION OF THE DRAWINGS

FIG. 1A illustrates a cooling cap applied over a circuit board, in accordance with one embodiment;

FIG. 1B shows an exploded view of the cooling cap assembly of FIG. 1A;

DETAILED DESCRIPTION

Figure 2A:
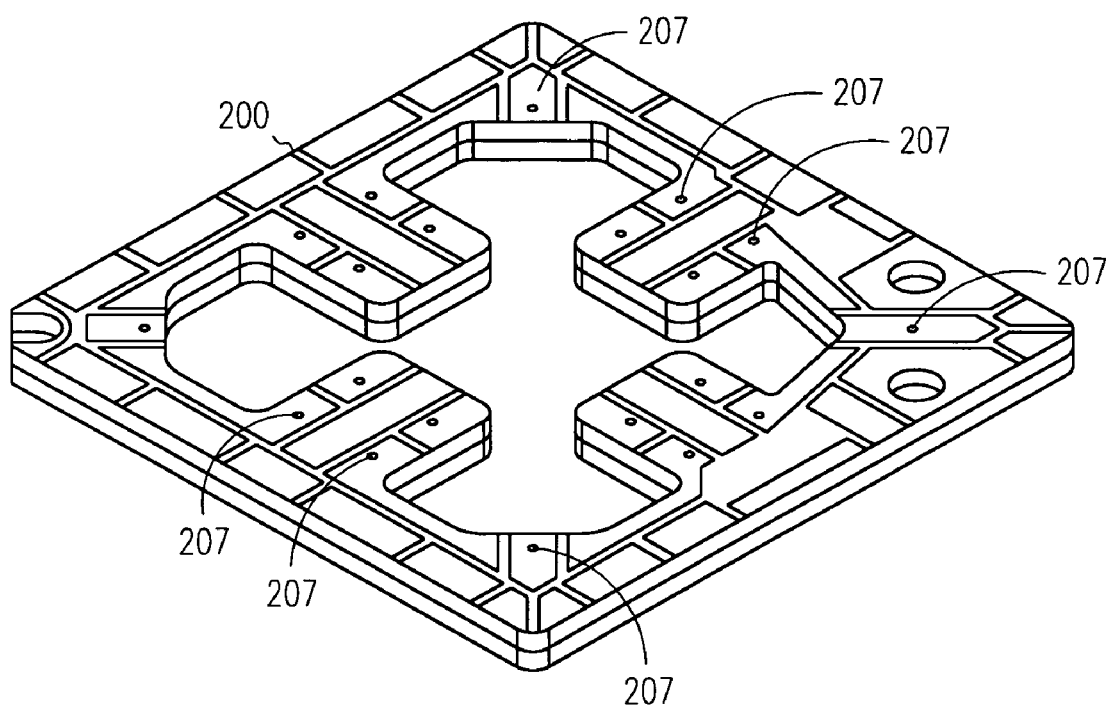
FIG. 2A illustrates a cooling spray delivery device of the cooling cap of FIG. 1, in accordance with one embodiment.

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

FIGS. 1A and 1B illustrate a spray cooling cap 100 mounted to a circuit board 102, in accordance with one embodiment. Mounted beneath cooling cap 100 are high power electrical components 109. Cooling cap 100 delivers a cooling spray to at least some of the components 109 on the circuit board. In one embodiment, cooling cap 100 is applied over heat generating components, such as electrical components 109, and mounted to the circuit board using a frame 110. Other configurations could be used as well. Cooling cap 100 includes a fluid input 112 and a fluid output 114 for injecting and removing liquid, respectively, from the cooling cap. For example, after the coolant is sprayed onto the integrated circuits it exits cooling. Cap 100 through output 114.

In one embodiment, the cooling fluid can include 3M's dielectric fluorocarbon, FC72. Its boiling temperature is 56 degrees C. at 1 atmosphere pressure. In some embodiments, other dielectric fluids are used. In one embodiment, water is used as a cooling fluid. Cooling cap 100 includes a spray delivery device, such as a spray plate 200, which directs a cooling spray towards the heat generating components 109.

FIG. 2A illustrates a bottom perspective view of spray delivery device or spray plate 200 in accordance with one embodiment. Spray plate 200 includes one or more nozzles 207 that deliver a coolant to a specific location. In one embodiment, the nozzles are configured to deliver a full-cone, non-uniform density spray pattern. As will be discussed below, this allows a designer to tailor the cooling characteristics of the spray delivery device.

Figure 2B:
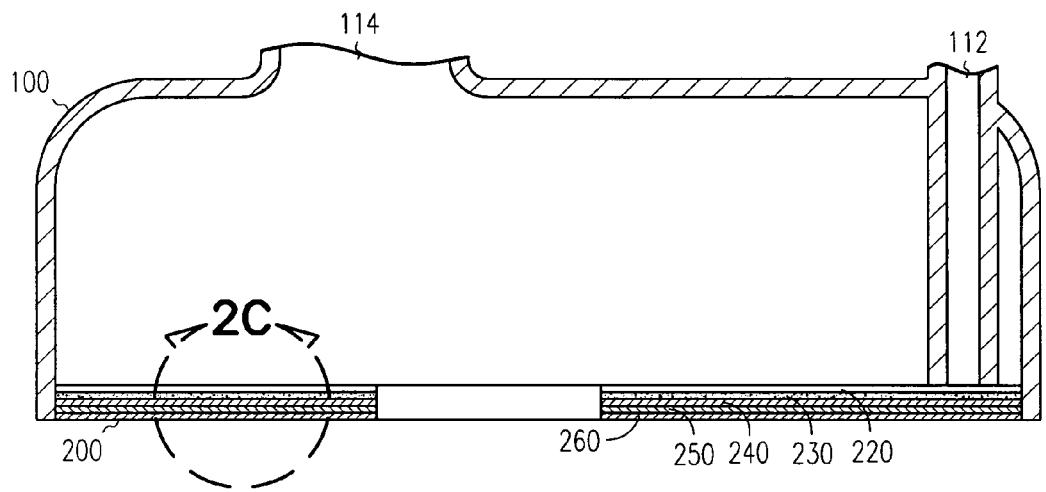
FIG. 2B illustrates a side section view of the spray delivery device of FIG. 2A.
Figure 2C:
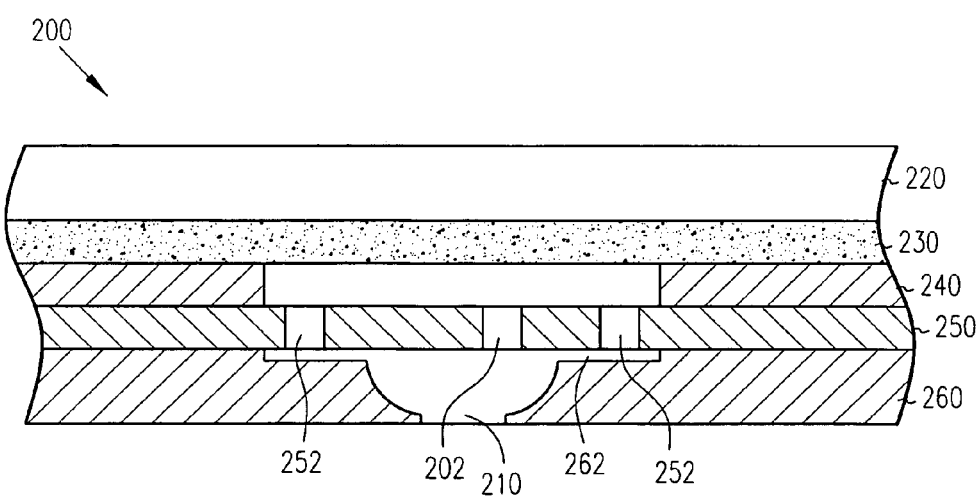
FIG. 2C illustrates a section view of the spray delivery device of FIG. 2B.

FIG. 2B shows a schematic illustration of a section view of spray plate 200 of cooling cap 100 in accordance with one embodiment. FIG. 2C shows further details of the spray plate. In one embodiment, the spray plate is an integral unit formed of a single plate having the inlets and outlets formed therein. In other embodiments, spray plate 200 can be formed of a series of laminated layers. For example, some embodiments include an inlet plate layer 220 to receive cooling fluid from input 112 of the cooling cap. Some embodiments include a strainer layer 230 between the inlet plate layer 220 and an adapter plate layer 240. Strainer layer 230 can strain impurities from the cooling fluid. The adapter plate layer 240 delivers cooling fluid to an inlet aperture plate layer 250. Coolant exits through outlets 210 in an outlet aperture plate layer 260.

In one embodiment, inlet aperture plate 250 includes inlet aperture(s) 202 and outlet plate 260 includes outlet aperture(s) 210. As will be discussed in further detail below, inlet apertures 202 are positioned in a non-aligned, offset manner over the corresponding outlet apertures 210 so as to deliver a radially asymmetric, non-uniform density spray pattern to a surface.

In one embodiment, spray plate 200 can include a swirler 262 adjacent each outlet aperture 210 and plate 250 can include a plurality of swirler inlet apertures 252 to deliver cooling fluid to the swirler 262. In some embodiments, swirler 262 can be formed directly in outlet aperture plate 260 or can be configured as a separate laminated plate. Swirlers 262 are radially extending from aperture 210 and after being fed cooling liquid the swirlers tangentially project the liquid into the swirl chamber.

In various embodiments, apertures 202, 252, 210 can be formed in the plates by chemical etching or machining. The walls of the apertures can be straight or bowl shaped. In some embodiments, the plates can be made of stainless steel. In one embodiment, each plate includes a thickness of about 0.013 inches.

In various embodiments, the inlet apertures can be about 0.009 inches in diameter, about 0.0083 inches in diameter with the outlet aperture about 0.0115 inches in diameter, or about 0.0112 inches in diameter. In some embodiments, the inlet apertures can be about 0.0113 inches in diameter or about 0.0102 inches in diameter. The outlet apertures can be about 0.0139 or about 0.0136 inches in diameter. The sizes can range between the sizes discussed above and can be larger or smaller in some embodiments. The ratio between the inlet/outlet apertures can be between 0.70 to about 0.85. In some examples the ratio is about 0.74 to 0.75.

Figure 3:
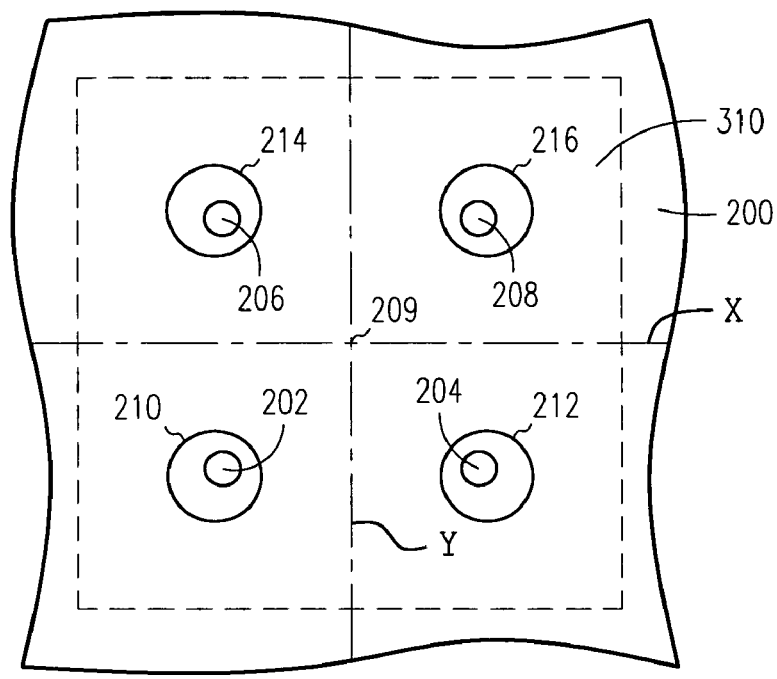
FIG. 3 illustrates a schematic top view of a portion of the spray delivery device of FIG. 2B.
Figure 4:
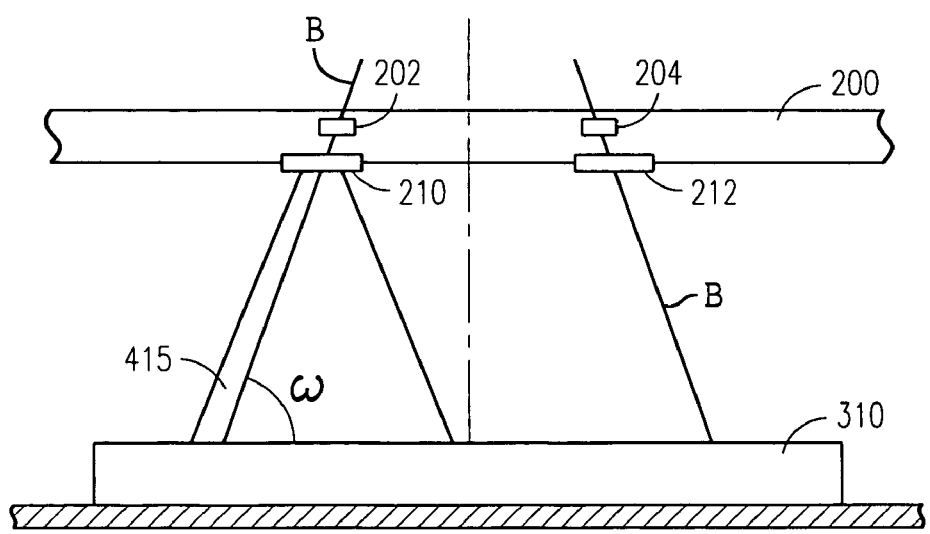
FIG. 4 illustrates a schematic cross-section side view of a portion of the spray delivery device of FIG. 2B.

FIGS. 3 and 4 illustrate a schematic top view and schematic side view of a portion of spray plate 200, in accordance with one embodiment. Again, spray plate 200 is adapted to deliver a radially asymmetric, non-uniform density spray pattern onto a surface of a heat generating component 310.

Referring to FIG. 4, spray plate 200 generally includes a plurality of inlet apertures 202, 204 and a plurality of corresponding outlet apertures 210, 212. In this embodiment, each pair of corresponding inlet apertures and outlet apertures (e.g. inlet aperture 202 and outlet aperture 210 are a pair of corresponding inlet and outlet apertures), are configured to form an asymmetric density full-cone spray pattern when a cooling liquid is delivered to the spray plate.

The fluid inlet apertures 202, 204 are located over a corresponding outlet aperture 210, 212, respectively to deliver fluid to the respective outlet aperture such that the cooling fluid has a full cone spray pattern 415. Full cone spray pattern 415 means that the spray pattern forms an exterior cone shape and the interior of the cone includes spray (i.e. it is not a hollow cone). However, the inlet apertures are non-centered and are offset over the outlet apertures such that the full cone spray has a spray pattern having a non-uniform and asymmetric density distribution as it strikes the surface. Thus, the center of inlet aperture 202, for example, is not directly aligned with or centered over the center of outlet aperture 210. This results in an axis of alignment B, and an angle of alignment a, illustrated in FIG. 4. This off-center positioning changes the density distribution of the full cone spray, placing a higher density towards a predetermined area of the spray cone as the spray hits a surface. The angle of alignment, a, can be between about 45 degrees and about 89 degrees, for example, in various embodiments. In some embodiments, the angle can be between about 65 degrees and about 85 degrees. In some embodiments, the angle can be between about 75 degrees to about 85 degrees. In one embodiment, the angle is about 80 degrees. The angle can be varied according to the distance from the outlet to the surface being cooled and also the amount of heat being dissipated on the die surface.

Referring to FIG. 3, in one example spray plate 200 includes at least four fluid inlet apertures 202, 204, 206, and 208 having a center point 209 therebetween. In this example, the four apertures 202-208 deliver cooling fluid to a single heat producing component 310. In this example, each of the four fluid inlet apertures 202-208 is located closer to the center point 209 relative to that fluid inlet aperture's corresponding outlet aperture 210, 212, 214, and 216, respectively. In one embodiment, the inlet aperture is offset from the center of the outlet aperture in the direction of the center line of the nozzle array. In other words, the inlet apertures are positioned towards the intersection of the central lines of symmetry X and Y. This results in the fluid from the inlet apertures being directed more towards the corners of the surface of component 310. With more spray being directed to the outside corners, less flow is involved in the interference zone for the cones. For this reason the overall flow is more evenly distributed over the surface being cooled. This allows for a higher amount of overall flow and a higher heat flux and cooling capacity. For example, about a 25%-50% increase in cooling fluid flow can be realized when using the asymmetric non-uniform, spray cone patterns discussed herein. By offsetting the inlet aperture, a designer is able to change the pattern of the atomized droplets in the cone. The density of the spray cone becomes non-uniform throughout the spray cone when the spray hits the surface.

Figure 5:
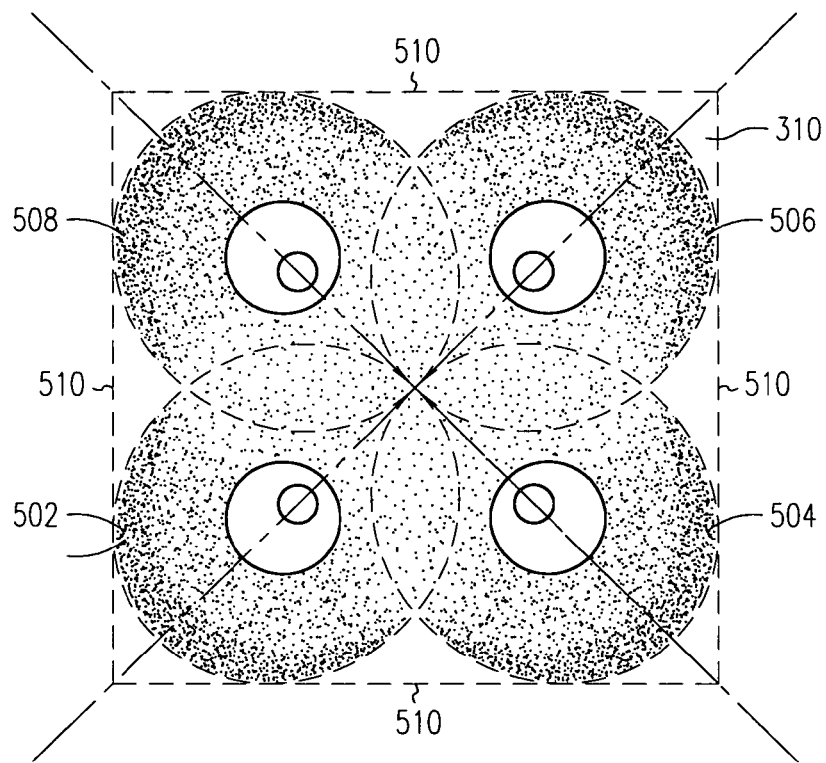
FIG. 5 shows a spray pattern of a spray delivery device according to one embodiment.

FIG. 5 shows a top view of a spray pattern of four overlapping spray cones 502, 504, 506, and 508 of a spray delivery device according to one embodiment. As illustrated, the darker portion of each cone has a higher concentration of droplets than the lighter portion of the cone. This pattern directs a higher density of cooling fluid towards the outside perimeter surface area 510 of component 310 being cooled. This allows for better distribution of the cooling fluid. For example, the illustrated spray pattern minimizes interference with the other overlapping cones. Also, by the adjustment of the alignment of the inlet apertures relative to the outlet aperture, the designer can control the spray pattern density of the cones.

In other embodiments, the pattern of the overlapping (or non-overlapping) cones can be tailored as desired. This structure increases the maximum heat flux at the burnout point of the design. It accomplishes this by minimizing the amount of fluid from each cone that interferes with the other three cones on each IC and collects in the middle of the dies.

Figure 6:
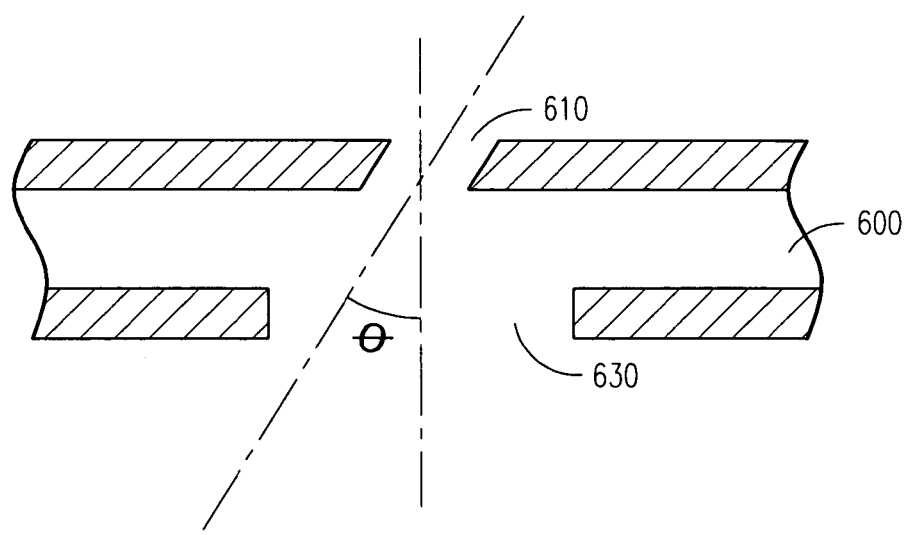
FIG. 6 shows a cross-section side view of a portion of a spray delivery device in accordance with one embodiment.

FIG. 6 shows a cross-section side view of a portion of a spray delivery device 600 in accordance with one embodiment. Details of device 600 are similar to device 200 described above and will not be discussed for sake of brevity. In this example, an inlet aperture 610 is generally centered over an outlet aperture 630. However, the center aperture includes an angled configuration defining an angle θ relative to the vertical orientation of the outlet aperture. Again, this delivers a full-cone spray having an asymmetrical non-uniform density spray pattern when it hits a surface. Angle θ can vary depending on the cooling needs. In some examples, it can be about 1 degree to about 85 degrees; it can be about 20 degrees to about 80 degrees; it can be about 45 degrees to about 80 degrees; it can be about 75 degrees to about 85 degrees.

In one example use, a cooling system can be designed as discussed above to include a cooling cap 100 having a spray plate 200 or a spray plate 600. The cooling cap is mounted over one or more heat generating components. A cooling fluid is delivered to the spray plate. The spray plate is configured to cool a heat generating component by delivering two or more overlapping full-cone sprays at a surface of the heat generating component, wherein each of the overlapping full-cone sprays includes a non-uniform density such that the overlapping portion of the spray cones has a lower spray density than the non-overlapping portions.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An apparatus comprising:
a spray delivery device having a plurality of fluid inlet apertures to deliver a cooling fluid towards a plurality of corresponding outlet apertures, wherein one or more of the plurality of fluid inlet apertures are offset from corresponding outlet apertures such that the cooling fluid passing through the apertures has a full cone spray pattern having an asymmetrical, non-uniform density distribution, wherein at least four fluid inlet apertures of the spray delivery device have a center point therebetween and wherein each of the four fluid inlet apertures is located closer to the center point relative to that fluid inlet aperture's corresponding offset outlet aperture.

2. The apparatus of claim 1, wherein the spray delivery device includes a first plate having the plurality of fluid inlet apertures and a second plate having the plurality of outlet apertures.

3. The apparatus of claim 1, wherein the at least four fluid inlet apertures and corresponding outlet apertures are arranged and configured to provide at least four overlapping full-cone sprays wherein each of the overlapping full-cone sprays includes a non-uniform density such that the overlapping portion of each of the overlapping full-cone sprays has a lower spray density than the non-overlapping portions of each of the overlapping full-cone sprays.

4. The apparatus of claim 1, wherein the spray delivery device includes a swirler adjacent each outlet aperture and a plurality of swirler inlet apertures to deliver cooling fluid to the swirler.

5. The apparatus of claim 1, including a plenum layer to feed cooling fluid to the fluid inlet apertures.

6. The apparatus of claim 5, including a strainer layer between the plenum layer and the inlet apertures.

7. A cooling system comprising:
a spray delivery device; and
a cooling liquid delivered to the spray delivery device, wherein the spray delivery device includes one or more inlet apertures and one or more corresponding outlet apertures, each pair of corresponding inlet apertures and outlet apertures being configured to form an asymmetrical, non-uniform density full cone spray pattern, wherein at least four fluid inlet apertures have a center point therebetween and wherein each of the four fluid inlet apertures is located closer to the center point relative to that fluid inlet aperture's corresponding outlet aperture.

8. The system of claim 7, wherein the cooling liquid includes a dielectric cooling fluid.

9. The system of claim 7, wherein the spray delivery device includes a laminated plate structure including a first plate having the one or more fluid inlet apertures and a second plate having the one or more corresponding outlet apertures.

10. The system of claim 9, wherein the at least four fluid inlet apertures and corresponding outlet apertures are arranged and configured to provide at least four overlapping full-cone sprays wherein each of the overlapping full-cone sprays includes a non-uniform density such that the overlapping portion of each of the overlapping full-cone sprays has a lower spray density than the non-overlapping portions of each of the overlapping full-cone sprays.

11. The system of claim 9, wherein the second plate includes a swirler adjacent each outlet aperture and the first plate includes a plurality of swirler inlet apertures to deliver cooling fluid to the swirler.

12. The system of claim 7, wherein one or more of the inlet apertures are offset from corresponding outlet apertures.

13. The system of claim 7, wherein the inlet apertures are positioned in a non-aligned manner over the corresponding outlet aperture.

14. A method comprising:
delivering a cooling fluid to a spray delivery device; and
positioning an inlet aperture relative to an outlet aperture on the spray delivery device such that the cooling fluid delivered through the spray delivery device forms an asymmetrical non-uniform density full cone spray pattern, wherein at least four fluid inlet apertures have a center point therebetween and wherein each of the four fluid inlet apertures is located closer to the center point relative to that fluid inlet aperture's corresponding outlet aperture.

15. The method of claim 14, wherein positioning includes positioning the inlet aperture over the outlet aperture such that the inlet aperture is non-centered over the outlet aperture.

* * * * *

UNITED STATES PATENT AND TRADEMARK OFFICE
CERTIFICATE OF CORRECTION

PATENT NO.       : 7,478,769 B1
APPLICATION NO.  : 11/075832
DATED            : January 20, 2009
INVENTOR(S)      : Pautsch et al.

It is certified that error appears in the above-identified patent and that said Letters Patent is hereby corrected as shown below:

On the Title Page on Page 2, under "Other Publications", Item -56-, line 5, delete "Responce" and insert -- Response --, therefor.

In column 2, line 18, delete "cooling. Cap" and insert -- cooling cap --, therefor.

In column 3, line 41, delete "a," and insert -- $\omega$, --, therefor.

In column 3, line 44, delete "a," and insert -- $\omega$, --, therefor.

Signed and Sealed this

Ninth Day of June, 2009

JOHN DOLL
*Acting Director of the United States Patent and Trademark Office*